(12) United States Patent
Satomi

(10) Patent No.: US 6,738,280 B2
(45) Date of Patent: May 18, 2004

(54) READ ONLY MEMORY

(75) Inventor: Katsuji Satomi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/195,379

(22) Filed: Jul. 16, 2002

(65) Prior Publication Data

US 2003/0016552 A1 Jan. 23, 2003

(30) Foreign Application Priority Data

Jul. 17, 2001 (JP) ..................................... 2001-217178

(51) Int. Cl.[7] .......................... G11C 17/00; G11C 7/00
(52) U.S. Cl. ...................... 365/94; 365/104; 365/203
(58) Field of Search .......................... 365/94, 104, 203

(56) References Cited

U.S. PATENT DOCUMENTS

| | | | | |
|---|---|---|---|---|
| 4,435,789 A | * | 3/1984 | Giebel et al. ............... | 365/104 |
| 5,142,495 A | * | 8/1992 | Canepa ....................... | 365/104 |
| 5,426,605 A | * | 6/1995 | Van Berkel et al. ......... | 365/104 |
| 5,831,892 A | * | 11/1998 | Thewes et al. ............... | 365/94 |
| 6,363,001 B1 | * | 3/2002 | Borot et al. ................. | 365/104 |
| 6,404,666 B1 | * | 6/2002 | Uchida ........................ | 365/104 |

OTHER PUBLICATIONS

A Bitline Leakage Compensation Scheme for Low–Voltage SRAMS, (IEEE Journal of Solid–State Circuits, vol. 36, No. 5, pp. 726–734, May 2001).

* cited by examiner

*Primary Examiner*—Trong Phan
(74) *Attorney, Agent, or Firm*—McDermott, Will & Emery

(57) ABSTRACT

N-channel MOS transistors are connected to bit lines so as to correspond to the data to be read out. A constant current outputting circuit uses an off leakage current of load transistors similar to the N-channel MOS transistors as a reference current to constitute a current mirror circuit having a mirror ratio according to the number of the N-channel MOS transistors connected to each bit line. P-channel MOS transistors of the constant current outputting circuit are connected to the bit lines and supply a current according to the off leakage currents of the N-channel MOS transistors. Thus, malfunctions caused by such as off leakage currents of transistors or the like can be reliably prevented without causing an increase in access time.

16 Claims, 10 Drawing Sheets

READ ONLY MEMORY

BACKGROUND OF THE INVENTION

1. Field of the Invention

The present invention relates to a technology pertaining to a bit line precharge-type semiconductor read only memory.

2. Description of the Related Art

Conventionally, a bit line precharge-type read only memory has been used in which data are stored according to whether or not there is a transistor connected to a bit line and the stored data are read out by detecting the potential of the bit line that has been precharged. Specifically, this type of read only memory has such a configuration as shown in FIG. 9.

As seen in the figure, precharge transistors Tr810 to Tr8n0, which constitutes a precharge circuit, are so configured as to precharge bit lines B810 to B8n0 under the control of a precharge signal 800.

Word lines W801 to W80m are respectively connected to the gates of N-channel MOS transistors Tr811 to Tr8nm, which constitute columns of transistors. More specifically, for example, the word line W801 is connected to the gates of the N-channel MOS transistors Tr811 to Tr8n1, the word line W802 is connected to the gates of the N-channel MOS transistors Tr812 to Tr8n2, and the word line W80m is connected to the gates of the N-channel MOS transistors Tr81m to Tr8nm.

The sources of the N-channel MOS transistors Tr811, etc. are grounded, whereas the drains are either connected to or cut off from the corresponding bit lines B810 to B8n0 according to the data ("0" or "1") to be recorded, Specifically, in the example shown in the figure, drains of N-channel MOS transistors Tr811, etc. are connected to the bit lines B110, etc. in the cases where data to be recorded are "0". Accordingly, when these N-channel MOS transistors, Tr811, etc. are tuned ON during read-out, the potentials of the bit lines B810, etc. to which the drains of the N-channel MOS transistors Tr811, etc. are connected are changed to a low level ("L" level).

P-channel MOS transistors Tr911 to Tr9n1 constitute pull-up circuits, and the drive capability of each of these P-channel MOS transistors is determined so that when data "1" is read out (i.e., when the drains of the N-channel MOS transistors Tr812, etc. that are turned ON are not connected to the bit lines B810, etc.), the potentials of the bit lines B810 to B8n0 are maintained at a high level ("H" level), and that the drive capability is less than that of the N-channel MOS transistors Tr811, etc.

The bit lines B810 to B8n0 are respectively connected to inverter circuits Inv811 and Inv812 to Inv8n1 and Inv8n2, which constitute output circuits.

In the read only memory as described above, data are read out according to the following operation.

(1) First, as shown in FIG. 10, the precharge signal 800 is reduced to an "L" level, the precharge transistors Tr810, etc. are switched to an ON state, and each of the bit lines B810 are precharged to an "1" level.

(2) Thereafter, in response to an input address signal (not shown), one of the word lines W801, etc. is selected and turns to an "H" level.

(3) Then, for example, when the word line W802 is selected and turns to an "H" level, the N-channel MOS transistors Tr812 to Tr8n2 that are connected to the word line W802 are switched to an ON state.

In this case, the drain of the N-channel MOS transistor Tr812 that is switched to an ON state is not connected to the bit line B810, and therefore, the potential of the bit line B810 is maintained at the "H" level by the P-channel MOS transistor Tr911 even after the precharge signal 800 has changed to the "H" level. Thus, a data "1" is output via the inverter circuits Inv811 and Inv812.

Meanwhile, the drain of the N-channel MOS transistor Tr822 that is also switched to an ON state is connected to the bit line B820 and, in addition, the drive capability of the P-channel MOS transistor Tr921 is made lower than the N-channel MOS transistor Tr822, as mentioned above. Therefore, the bit line B810 is discharged and the potential is reduced to an "L" level. Thus, a data "0" is output via the inverter Inv821 and Inb822.

In recent years, miniaturization has advanced in the process for CMOS semiconductor integrated circuit, and the power supply voltage has been more and more scaled as the thickness of the gate oxide film reduces. In order to avoid a operating speed reduction caused by the decrease of power supply voltage, there has been a trend toward reduction in threshold voltages of MOS transistors.

When the threshold voltage is reduced, however, the off leakage current of a MOS transistor increases. Consequently, in read only memories in which a number of drain nodes are connected to bit lines, the potentials of the bit lines tend to fluctuate, often causing device malfunctions. For example, in read only memories, the number of N-channel MOS transistors that are connected to bit lines often exceeds 1000, and therefore, even if the leakage current of each transistor is small, the total of the leakage current well exceeds a negligible level and affects circuit operation to cause malfunctions.

More specifically, assuming a case, for example, where there are a large number of the N-channel MOS transistors Tr811, etc. whose drains are connected to the bit line 810 (i.e., a case where many data "0"s are written), when the word line W802 turns to an "H" level as described above, then the potential of the bit line B810 cannot be maintained at the "H" level, as shown by the dashed line in FIG. 10 and results in an output data "0", when the total of the off leakage currents of the N-channel MOS transistors Tr811 to Tr81m (except Tr812) exceeds the current that the pull-up circuit can supply (i.e., exceeds the drive capability), even though the drain of the N-channel MOS transistor Tr812 is not connected to the bit line B810 (i.e., even though a data "1" has been written therein). This phenomenon is apt to occur particularly at high temperatures, at which the off leakage current increases.

On the other hand, if the drive capability of the pull-up circuit is increased to prevent such a malfunction as described above, the discharge operation by the N-channel MOS transistor Tr822 is hindered by the pull-up circuit in the bit line B820, which is supposed to output a data "0," and a time lag until the bit line B820 reaches the "L" level becomes long as shown by the dash-dot line in FIG. 9. This causes an increase in access time during read-out.

Moreover, as the potential of the bit line B820 is reduced by discharging, the voltage between the source and the drain of the P-channel MOS transistor Tr921 (pull-up circuit) increases, thereby increasing the current supplied to the bit line B820. As a result, the potential of the bit line B820 cannot be reduced below the threshold level of the inverter circuit Inv821, further increasing the possibility of malfunctions.

SUMMARY OF THE INVENTION

In view of the foregoing and other problems, it is an object of the present invention to reliably prevent malfunctions of read only memories caused by, for example, off leakage current of transistors without increasing access time.

This and other objects are accomplished, in accordance with a first aspect of the present invention, by providing a read only memory having a plurality of bit lines, a plurality of word lines, and a plurality of switching elements, wherein data corresponding to the presence or absence of switching elements connected to the bit lines are read out by discharging electric charge precharged in the bit lines with the switching elements selected by the word lines, the read only memory comprising: at least one current supplying circuit that supplies current to one of the bit lines when the switching elements are selected by the word lines; wherein the current supplying capability of the current supplying circuit is determined according to the number of the switching elements connected to the one of the bit lines.

With this configuration, the off leakage current of the switching elements that are not selected by the word lines is appropriately compensated sufficiently but not excessively by the current supplying circuit having a current supplying capability according to the number of the switching elements. Specifically, when the number of the switching elements connected to a bit line is large, the current supplying capability of the current supplying circuit that supplies current to the bit line is determined to be large, so that malfunctions caused by a decrease in the potential of the bit line can be prevented, whereas when the number of the switching elements connected to a bit line is small, the current supplying capability is determined to be small, so that malfunctions and operation speed degradations can be prevented that are caused by the obstruction to the discharge operation of the switching elements that are selected by word lines and are switched to an ON state.

In the above-described read only memory, the current supplying circuit may be a constant current circuit.

With this configuration, even if the potential of the bit line is reduced by the discharge of the switching elements that are selected and turned ON by the word lines, the potential of the bit line can be reliably reduced because the supplied current does not fluctuate. Specifically, in the case where a current is supplied to a bit line by a MOS transistor, as the potential of the bit line decreases, the supplied current increases since the voltage between the source and the drain of the MOS transistor increases. Therefore, the potential of the bit line cannot be sufficiently reduced, and the margins for switching levels of the output circuit tend to be small. In view of this, as described above, when a current is supplied to the bit line using a constant current circuit, the supplied current does not increase even if the potential of the bit line decreases. Thus, the potential of the bit line can be quickly and sufficiently reduced and consequently, operation speed is improved while margins of the output circuit are increased.

In the above-described read only memory, the constant current circuit may include a reference current generating circuit for generating a predetermined reference current using the same type of switching element as the switching elements; and a current mirror circuit for mirroring the reference current and supplying electric current to the bit line; wherein the mirror ratio of the current mirror circuit is determined according to the number of the switching elements.

With this configuration, since the current mirror circuit can supply a constant current that is proportional to a reference current, a constant current according to the number of the switching element connected to a bit line can be easily supplied to the bit line by appropriately determining the mirror ratio. In addition, since a current is supplied to the bit line using the current generated by a switching element of the same type as the switching element connected the bit line as a reference current, the off leakage current of the switching elements connected to the bit line can be easily compensated appropriately. Specifically, the use of a current mirror circuit makes it possible to supply a current for compensating an off leakage current, for example, using off transistors having characteristics corresponding to the transistors connected to the bit line (temperature characteristics and power supply voltage characteristics). Therefore, in comparison with conventional cases in which an on current of transistors is supplied, the accuracy of current compensation can be more easily increased without carrying out difficult matching of characteristics. Moreover, the off leakage current can be effectively cancelled against fluctuations in ambient conditions such as power supply voltages and ambient temperatures.

In the above-described read only memory, the current supplying circuit may supply an electric current to the bit line when the potential of the bit line is higher than a predetermined potential whereas the current supplying circuit may cut off electric current to the bit line when the potential of the bit line is lower than the predetermined potential.

With this configuration, the current supply is stopped when the potential of the bit line is reduced to a lower potential than a predetermined potential by the discharge of the switching elements selected by word lines and turned ON, and therefore, the potential of the bit line can be reduced more quickly and reliably thereafter. Consequently, margins in discharge operations can be increased.

In the above-described read only memory, the numbers of the switching elements to be connected to the bit lines may be categorized into a plurality of groups, and the current supplying capability of the current supplying circuit may be determined according to the groups.

With this configuration, the variety of current supplying circuits having differing current capabilities can be reduced, and therefore, simplification of the configurations can be easily achieved.

The above-described read only memory may further have a current adjusting circuit for adjusting the current supplying capability according to the potential of the bit line when all the switching element connected to the bit line are in an OFF state.

In the above-described read only memory, the current adjusting circuit may include a comparator circuit that compares the potential of the bit line with a predetermined reference potential when all the switching elements connected to the bit line are in an OFF state; a holding circuit that holds a comparison result obtained by the comparator circuit; and an adjusted current supplying circuit that supplies a current to the bit line according to the data held in the holding circuit.

With these configurations, even when the off leakage current fluctuates, for example, due to variations of the off leakage characteristics of the switching elements, a current corresponding to the fluctuating off leakage current can be supplied to the bit line by, for example, monitoring the potential of the bit line when the switching elements are in an OFF state. Therefore, a discrepancy between the off leakage current and the supplied current is suppressed and the off leakage current can be compensated more reliably.

In accordance with another aspect of the present invention, a read only memory is provided having a plurality of bit lines, a plurality of word lines, and a plurality of switching elements, wherein data corresponding to the presence or absence of switching elements connected to the bit lines are read out by discharging electric charge precharged in the bit lines with the switching elements selected by the word lines, the read only memory comprising: a plurality of current supplying portions that constitute a current supplying circuit having a predetermined current supplying capability and supplying electric current when the switching elements are selected to the word line; wherein at least one of the current supplying portions is connected to one of the bit lines according to the number of the switching elements connected to the bit line.

With this configuration, when fabricating a read only memory, current supply to the bit line is effected with current supplying capabilities according to varying write data by merely controlling the connection or the disconnection between the current supplying portions and the bit line, and the portions except the connection or the disconnection can be communized between the read only memories having different write data. Therefore, automatic design layout of the elements or the like for the read only memory is easily achieved, and the fabrication can be facilitated as a result of the simplification of the fabrication process. Moreover, in the process of forming contacts after the formation of transistors, current supplying capabilities can be set in addition to ROM data, and this contributes to a reduction in the lead time from the time when the ROM data are decided until the entire fabrication process is completed.

In accordance with yet another aspect of the invention, a read only memory is provided comprising: a plurality of switching elements provided so as to be connectable to and/or disconnectable from bit lines; wherein data to be read out are set by connecting and/or disconnecting the switching elements to/from the switching elements from the bit lines; and wherein, when reading out data, data corresponding to the presence or absence of switching elements connected to the bit lines are read out by discharging electric charge precharged in the bit lines with the switching elements selected by word lines; wherein the read only memory has a plurality of current supplying portions that constitute a current supplying circuit and are provided so as to be connectable to and/or disconnectable from the bit lines, the current supplying portions supplying electric current to the bit lines when the switching elements are selected by the word lines.

With this configuration, it is made possible to set the number of current supplying portions that are connected to a bit line in a data writing in read only memories in which data can be set (written) after the manufacture as well. Therefore, by appropriately compensating the off leakage current as described above, malfunctions and operation speed reductions are prevented.

DETAILED DESCRIPTION OF THE INVENTION

The present invention now will be described with reference to the accompanying drawings.

Embodiment 1

Figure 1:
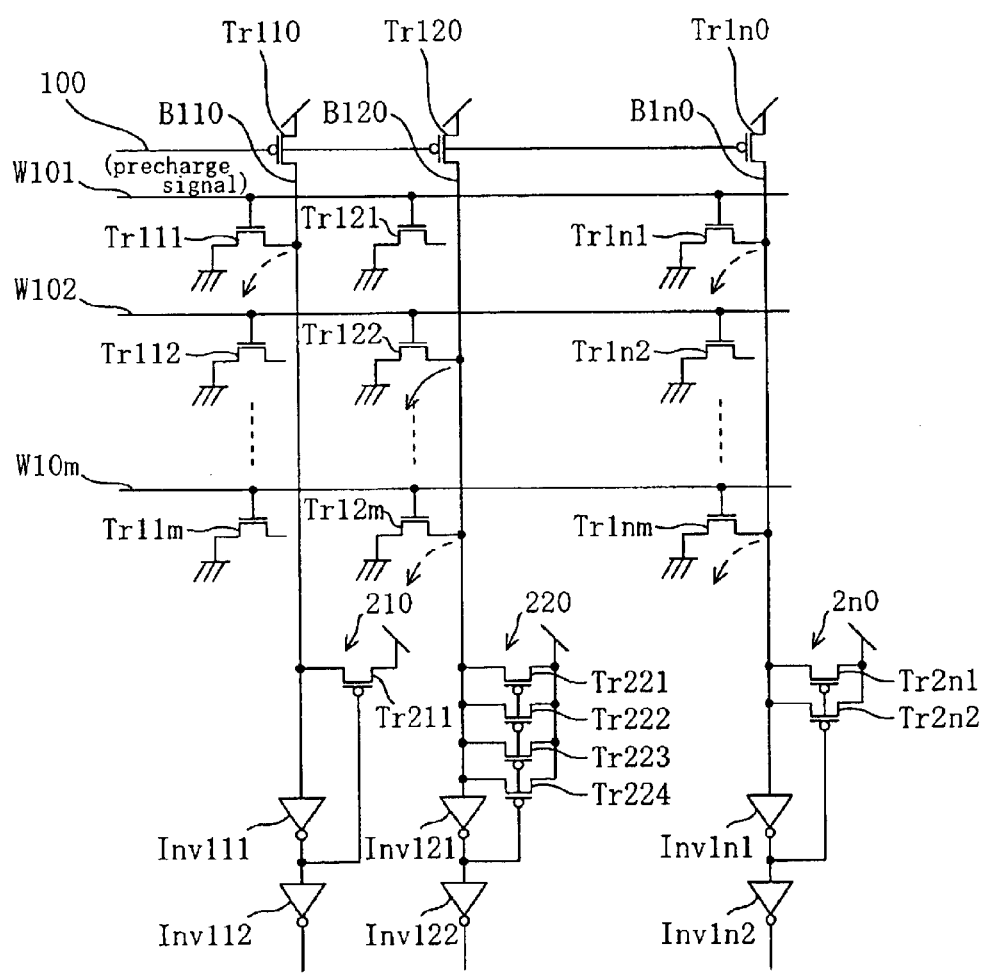
FIG. 1 is a circuit diagram showing the configuration of the principal portion of a read only memory according to Embodiment 1.

FIG. 1 shows a circuit diagram illustrating the configuration of the principal portion of a read only memory according to Embodiment 1.

As seen in the figure, precharge transistors Tr110 to Tr1n0, which constitutes a precharge circuit, are so configured as to precharge bit lines B110 to B1n0 under the control of a precharge signal 100.

Word lines W101 to W10m are respectively connected to the gates of N-channel MOS transistors Tr111 to Tr1nm, which constitute transistor columns. More specifically, the word line W101 is connected to the gates of the N-channel MOS transistors Tr111 to Tr1n1, the word line W102 is connected to the gates of the N-channel MOS transistors Tr112 to Tr1n2, and the word line W10m is connected to the gates of the N-channel MOS transistors Tr11m to Tr1nm. It is noted that the variables "n" and "m" as utilized in conjunction with the designation of components herein indicate the placement of given components within the memory array with respect to one another.

The sources of the N-channel MOS transistors Tr111, etc. are grounded, whereas the drains are either connected to or cut off from the corresponding bit lines B110 to B1n0 according to the data ("0" or "1") to be recorded. Specifically, in the example shown in the figure, drains of N-channel MOS transistors Tr111, etc. are connected to the bit lines B110, etc. in the cases where data to be recorded are "0". Accordingly, when these N-channel MOS transistors Tr111, etc. are tuned ON during read-out, the potentials of the bit lines B110, etc. to which the drains of the N-channel MOS transistors Tr111, etc. are connected are changed to a low level ("L" level).

The bit lines B110 to B1n0 are respectively connected to inverter circuits Inv111 and Inv112 to Inv1n1 and Inv1n2, which constitute output circuits.

Each of pull-up circuits (current compensating circuits) 210 to 2n0 that are respectively connected to the bit lines B110 to B1n0 has one or more P-channel MOS transistors Tr211, etc. The drains of the P-channel MOS transistors Tr211, etc. are connected to the corresponding bit lines B110, etc., whereas the gates thereof are connected to the outputs of corresponding inverter circuits Inv111, etc. These pull-up circuits 210 to 2n0 are so configured that, when the potentials of the bit lines B110, etc. are a high level, i.e., an "H" level (when the outputs from the inverter circuits Inv111, etc. are an "L" level), each of the P-channel MOS transistors Tr211, etc. is switched to an ON state to maintain the "H" level (precharge level) state of the bit lines B110, etc. (so that they function as potential regulating circuits).

Each of the pull-up circuits 210 to 2n0 has a drive capability (current supplying capability) according to the number of N-channel MOS transistors Tr111, etc. connected to the respective one of the bit lines B110 to B1n0. More specifically, the drive capability of the pull-up circuit 210, for example, is determined as follows. The pull-up circuit 210 is capable of supplying a current that is comparable to the total of the off leakage currents of the N-channel MOS transistors Tr111 to Tr11m when all the N-channel MOS transistors Tr111 to Tr11m connected to the bit line 110 are in an OFF state and the potential of the bit line 110 is higher than the input threshold level of the inverter circuit Inv111. Also, the drive capability should be smaller than that of each of the N-channel MOS transistors Tr111 to Tr11m (i.e., the pull-up circuit 210 can supply only a smaller current than the ON current of each of the N-channel MOS transistors Tr111 to Tr11m). It should be noted here that the drive capability is not necessarily such that it is capable of supplying a current that is exactly at the same level to the total of the off leakage currents. In other words, it is only necessary that, even if the current is less than the same level, the driving capability should be at such a level or higher that the potential of the bit line B110 can be maintained at the "H" level when all the N-channel MOS transistors Tr111, etc. are in an OFF state, and that even if the current is higher than the same level, the potential of the bit line B110 can be reduced to an "L" level.

The drive capability as described above can be determined from the number and transistor size of the P-channel MOS transistors Tr211, etc., which constitute the pull-up circuits 210, etc. Specifically, as shown in the following, the numbers of the P-channel MOS transistors Tr211, etc. provided in each of the pull-up circuits 210, etc. are determined so as to correspond to the number of the N-channel MOS transistors Tr111, etc. whose drains are connected to the corresponding bit lines B110, etc. (to be precise, the number of the transistors are set so as to correspond to the four groups classified as follows).

(a) When the number of the N-channel MOS transistors is $m \times \frac{1}{4}$ or less,
the number of the P-channel MOS transistors is 1
(for example, as in the case of the pull-up circuit 210);

(b) When the number of the N-channel MOS transistors is $m \times \frac{1}{4}+1$ to $m \times \frac{2}{4}$,
the number of the P-channel MOS transistors is 2
(for example, as in the case of the pull-up circuit 2n0);

(c) When the number of the N-channel MOS transistors is $m \times \frac{2}{4}+1$ to $m \times \frac{3}{4}$,
the number of the P-channel MOS transistors is 3;

(d) When the number of the N-channel MOS transistors is $m \times \frac{3}{4}+1$ or greater,
the number of the P-channel MOS transistors is 4
(for example, as in the case of the pull-up circuit 220).

The transistor sizes of the P-channel MOS transistors Tr211, etc. are equal to each other, and the current that each of the transistors can supply is determined so as to be comparable to the total of the off leakage currents of $m/4$ N-channel MOS transistors Tr111, etc. and to be less than the ON current of each one of the N-channel MOS transistors Tr111, etc.

The drive capability may be set by combining a plurality of transistors each having a smaller size than those described above. In addition, the same drive capabilities as the drive capabilities obtained with 2 to 4 transistors as described above may be obtained by employing one transistor having a large size.

Figure 2:
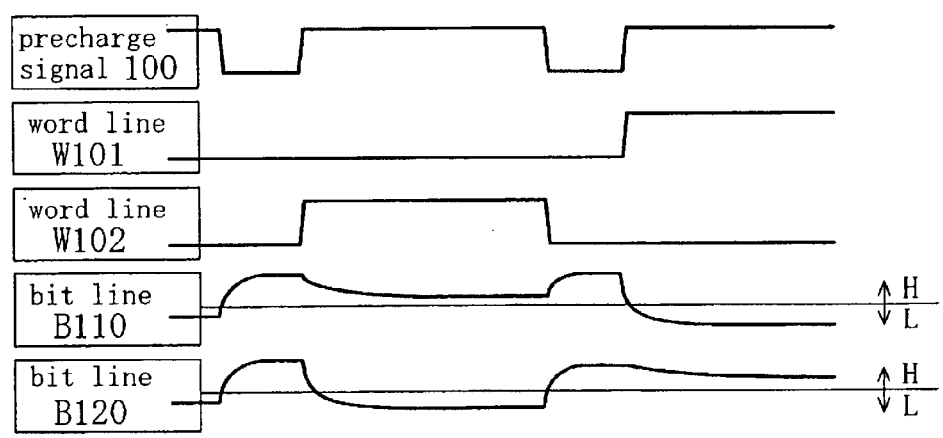
FIG. 2 illustrate signal levels in various portions thereof.

The operation of the read only memory described above is as follows:

(1) First, as shown in FIG. 2, the precharge signal 100 is reduced to an "L" level, the precharge transistors Tr110, etc. are switched to an ON state, and each of the bit lines B110 are precharged to an "H" level.

(2) Thereafter, in response to an input address signal (not shown), one of the word lines W101 is selected and turns to an "H" level.

(3) Then, for example, when the word line W102 is selected and turns to an "H" level, the N-channel MOS transistors Tr112 to Tr1n2 that are connected to the word line W102 are switched to an ON state.

In this case, the N-channel MOS transistor Tr112, for example, is in an ON state, but the drain thereof is not connected to the bit line B110, so the bit line B110 is not discharged through the N-channel MOS transistor Tr112. In addition, as described above, the number of the N-channel MOS transistors Tr111, etc. that are in an OFF state and whose drains are connected to the bit line B110 is $m/4$ or less (see (a) above), and the total of the off leakage currents is at most the same level as the current that the P-channel MOS transistor Tr211 is capable of supplying.

Therefore, the P-channel MOS transistor Tr211 can supply the bit line B110 with a sufficient charge current that is comparable to the discharge current (can sufficiently compensate the off leakage current). Accordingly, the potential of the bit line B110 is reliably maintained at the "H" level, that is, a level higher than the threshold level of the inverter circuit Inv111, even after the precharge signal 100 turns to an "H" level, and as a result, a data "1" is reliably output through the inverter circuits Inv111 and Inv112.

On the other hand, the drain of the N-channel MOS transistor Tr122, for example, that is in an ON state is connected to the bit line B120. In addition, $m \times \frac{3}{4}+1$ or a greater number of the N-channel MOS transistors Tr12m, etc. that are in an OFF state are also connected to the bit line B120 (see (d) above). The total of the ON current of the N-channel MOS transistor Tr122 that is in an ON state and the off leakage currents of the $m \times \frac{3}{4}+1$ or a greater number of the N-channel MOS transistors Tr12m, etc. that are in an OFF state is greater than the current that the four P-channel MOS transistors Tr221 to Tr224 are capable of supplying. This is due to the fact that the off leakage current of $m \times \frac{3}{4}+1$ N-channel MOS transistors Tr12m, etc. that are in an OFF state is at the same level as the current that three P-channel MOS transistors Tr221, etc. can supply, and the ON current of the single N-channel MOS transistor Tr122 that is in an ON state is larger than the current that each one of the P-channel MOS transistors Tr221, etc. can supply. Thus, the bit line B120 is quickly discharged after the precharge signal 100 turns to an "H" level and the potential is reduced to an "L" level. When the potential of the bit line B120 becomes lower than the threshold level of the inverter circuit Inv121, the output from the inverter circuit Inv121 is inverted to the "H" level while the output is inverted from the inverter circuit Inv122 to an "L" level. Thus, a data "0" is output through the inverter circuits Inv121 and Inv122. Here, when the output from the inverter circuit Inv122 turns to an "L" level, the P-channel MOS transistors Tr221 to Tr224 are switched to an OFF state, and therefore, the potential of the bit line B120 reduces more quickly.

(4) Next, when the word line W101, for example, is selected and turns to an "H" level, as in a similar manner to (1) and (2) described above, the N-channel MOS transistors Tr111 to Tr1n1 connected to the word line W101 are turned to an ON state. In this case as well, as shown in FIG. 2, the potentials of the bit lines B110 and B120, for example, reliably result in an "L" level or an "H" level, and the corresponding data "0" or "1" is output from the inverter circuit Inv112 and Inv122.

As described above, when the numbers and transistor sizes of the P-channel MOS transistors Tr211, etc. that constitute the pull-up circuits 210, etc. (i.e., the drive capability) are determined according to the numbers of the N-channel MOS transistors Tr111, etc. that are connected to the bit lines B110, etc. (i.e., according to levels of the off leakage currents) in the manner described above, malfunctions caused by off leakage current can be prevented without reducing a read-out speed for the "L" level data ("0"). Accordingly, the operating power supply voltages as well as the threshold voltage of the transistors can be lowered to achieve fast circuit operations and low power consumption.

Embodiment 2

Embodiment 2 describes an example of a read only memory in which a constant current is supplied to a bit line by a constant current circuit. In the following embodiments, elements that have similar functions to those described in the foregoing such as those in Embodiment 1 are referenced by like reference numerals and designations, and the detailed explanations are omitted.

Figure 3:
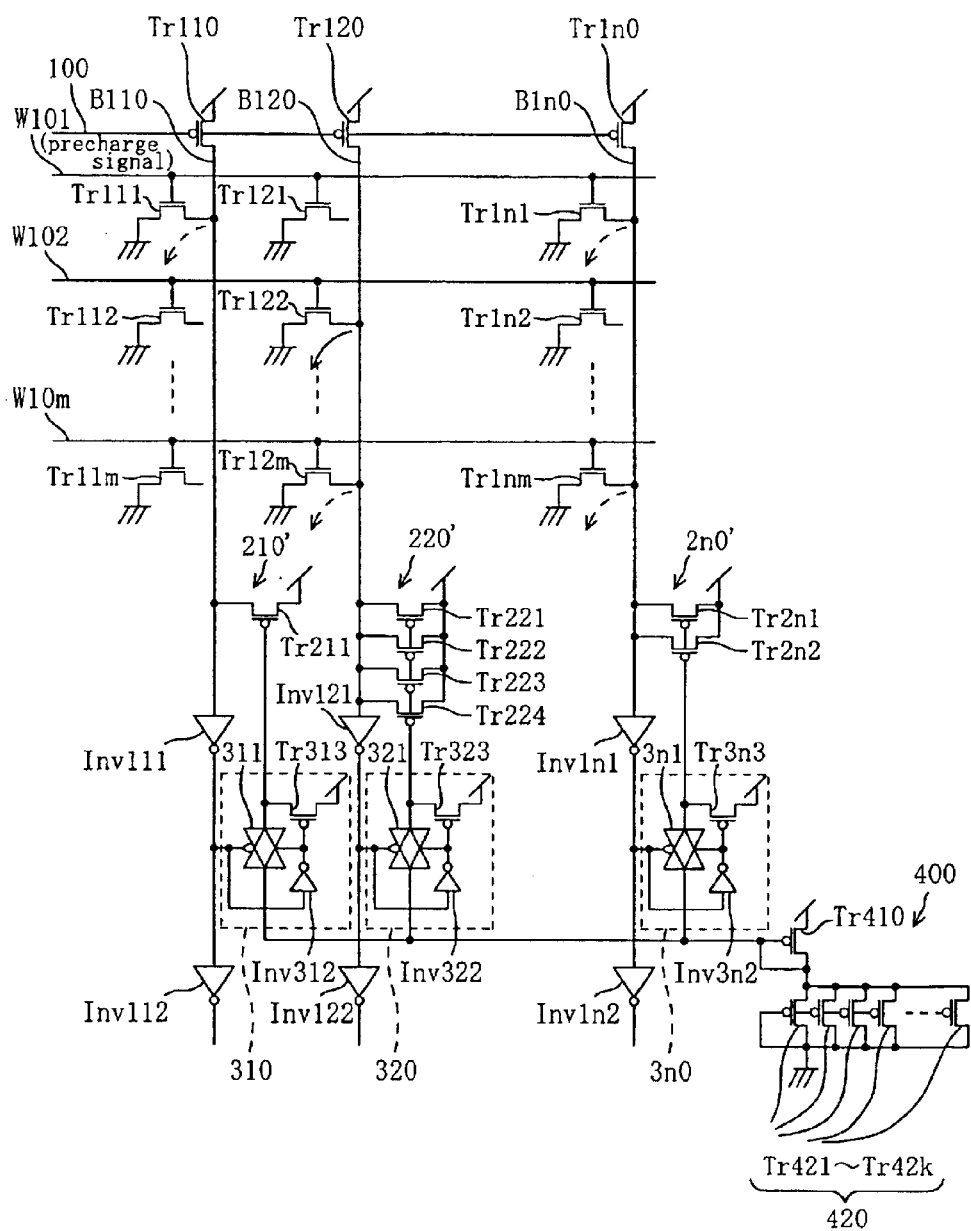
FIG. 3 is a circuit diagram showing the configuration of the principal portion of a read only memory according to Embodiment 2.

FIG. 3 is a circuit diagram showing the principal portion of a read only memory according to Embodiment 2 of the present invention. This read only memory is, in addition to the configuration described in the foregoing embodiment 1, provided with constant current supply-controlling circuits 310 to 3n0 and a constant current controlling circuit 400. In addition, constant current outputting circuits 210' to 2n0' are provided in place of the pull-up circuits 210, etc. These constant current outputting circuits 210', etc. are composed of the same P-channel MOS transistors Tr211, etc. that constitute the pull-up circuits 210, etc., but they differ therefrom in that the gates of the P-channel MOS transistors Tr211, etc. are connected to the constant current controlling circuit 400 via the constant current supply-controlling circuits 310 to 3n0, but not to the output of the inverter circuits Inv111, etc. A constant current circuit is composed of these constant current outputting circuits 210' to 2n0' and the constant current controlling circuit 400.

The constant current supply-controlling circuits 310 to 3n0 have transfer gates 311 to 3n1, inverter circuits Inv312 to 3n2, and constant current cut-off transistors Tr313 to Tr3n3, and control the constant current outputting circuits 210', etc. so as to turn to a current supplied state or a halted state. More specifically, the transfer gates 311, etc. are provided between the gates of the P-channel MOS transistors Tr211, etc. in the constant current outputting circuits 210', etc. and the constant current controlling circuit 400, and are so configured that the constant current outputting circuits 210', etc. and the constant current controlling circuit 400 are electrically connected when the potentials of the bit lines B110, etc. are at an "H" level, whereas they are cut off when at an "L" level, according to the output from the inverter circuits Inv111, etc. and the inverter circuits Inv312, etc. The constant current cut-off transistors Tr313, etc. are so configured that, by applying power supply voltage to the gases of the P-channel MOS transistors Tr211, etc., the supply of electric current to the bit lines B110, etc. through the constant current outputting circuits 210', etc. is stopped when the potentials of the bit lines B110, etc. are at an "L" level.

The constant current controlling circuit 400 is composed of a constant current controlling transistor Tr410 and a load circuit 420 having m/4 number of load transistors Tr421 to Tr42k (k=m/4). More specifically, the load transistors Tr421 to Tr42k are N-channel MOS transistors having the same configurations and characteristics as the N-channel MOS transistors Tr111, etc. that have been described previously, and are so configured that the gates and the sources are both grounded (so as to be off transistors) and a constant current is drawn from the drain of the constant current controlling transistor Tr410. The constant current controlling transistor Tr410 is a P-channel MOS transistor in which the drain is connected to the gate, and the gate node is also connected to the gates of the P-channel MOS transistors Tr211, etc. of each of the constant current outputting circuits 210', etc. via the constant current supply-controlling circuits 310 to 3n0 as described above so that current mirror circuits are formed by which the drain currents of the P-channel MOS transistors Tr211, etc. are made equal to the drain currents brought into the load transistors Tr421 to Tr42k. The transistor size and the like of the constant current controlling transistor Tr410 are determined so that the gate voltages of the P-channel MOS transistors Tr211, etc. are at an intermediate voltage that is somewhat lower than the power supply voltage. It should be noted that the configurations and characteristics of the load transistors Tr421 to Tr42k and the N-channel MOS transistors Tr111, etc. need not be exactly the same, and it is only necessary that both elements have approximately a certain relationship such that, for example, various characteristics thereof (for example, off leakage characteristics) are in a proportional relationship even when sizes of the elements are different, but it is preferable that both elements are formed on the same chip by the same fabrication process.

In the read only memory configured in a manner described above, the read-out operation for stored data itself is similar to that in the foregoing embodiment 1; however, when the N-channel MOS transistors Tr111, etc. are in an ON state and the potentials of the bit lines B110, etc. are thereby reduced, the supplied current to the bit lines B110, etc. does not increase even if the voltage between the sources and drains of the P-channel MOS transistors Tr211, etc. increases because a constant current that is equal to the current flowing in the load circuit 420 is supplied to the bit lines B110, etc. Therefore, the potentials of the bit lines B110, etc. are quickly and reliably reduced to a level that is lower than the threshold level of the inverter circuits Inv111, etc., and thus malfunctions can be prevented. From this viewpoint, the above-described constant current circuit may be regarded as a power supply circuit having a limiter.

In addition, as described above, by obtaining a reference current for the constant current circuit using the load transistors Tr421, etc. having the same configurations and characteristics as the N-channel MOS transistors, Tr111, etc., the off leakage current and the current supplied from the constant current outputting circuits 210', etc. can be easily matched within the range in which variations of the transistors are permissible, and in addition, the accuracy of current compensation can be increased against variations due to the surrounding environment such as variations in power supply voltage or ambient temperature. Therefore, operation margins can be increased in both the operation in which the bit lines B110, etc. are maintained at the "H" level and the operation in which the bit lines B110, etc. are discharged to suppress malfunctions and to improve operation speed.

Embodiment 3

Embodiment 3 describes an example of a read only memory that is configured such that even when there are variations in the off leakage current, the constant current is automatically adjusted according to the variations or the like in order to carry out a more appropriate current supply.

Figure 4:
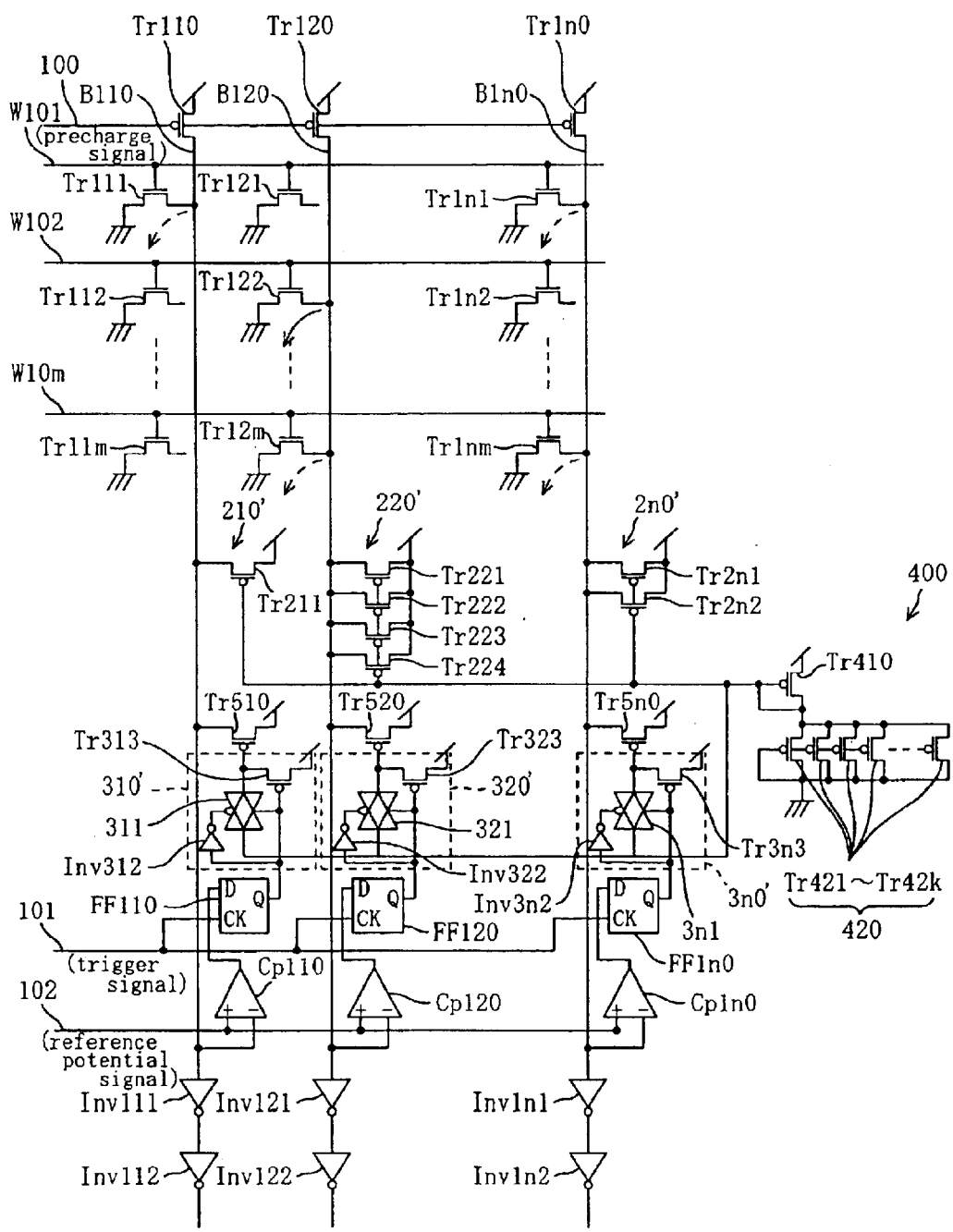
FIG. 4 is a circuit diagram showing the configuration of the principal portion of a read only memory according to Embodiment 3.

FIG. 4 is a circuit diagram showing the principal portion of a read only memory according to Embodiment 3 of the present invention. This read only memory differs from the configuration of the foregoing embodiment 2 in that constant current supply-controlling circuits 310', etc. are provided in place of the constant current supply-controlling circuits 310, and comparator circuits Cp110 to Cp1n0, edge triggered flip-flop circuits FF110 to FF1n0, and current adjusting transistors Tr510 to Tr5n0 are additionally provided.

The constant current controlling circuit 400 is the same one as that of Embodiment 2, but is directly connected to the gates of the P-channel MOS transistors Tr211, etc. so as to supply a current to the bit lines B110, etc.

The constant current supply-controlling circuits 310' is provided so as to control the gate voltages of the current adjusting transistors Tr510, etc., not of the P-channel MOS transistors Tr211, etc., and the configuration is generally similar to the constant current supply-controlling circuits 310, etc. except that it is so configured that the level of the input control signal is opposite. Specifically, when the outputs Q of the flip-flop circuits FF110, etc. are at an "H" level, the transfer gates 311, etc. are switched to a conductive state to let the current adjusting transistors Tr510, etc. supply a current to the bit lines B110, etc., whereas when at an "L" level, the transfer gates 311, etc. are switched to a cut-off state and the constant current cut-off transistors Tr313, etc. apply power supply voltage to the gates of the current adjusting transistors Tr510, etc. in order to stop the current supply to the bit lines B110, etc.

The current adjusting transistors Tr510, etc. that are controlled by the constant current supply-controlling circuits 310', etc. are formed with a transistor size that is half the size of the P-channel MOS transistors Tr211, etc.

The comparator circuits Cp110, etc. are so configured that they compare the potentials of the bit lines B110 with a predetermined reference potential signal 102, specifically, with a predetermined potential between the threshold level of the inverter circuits Inv111, etc. and the power supply voltages, and accordingly, they output an "L" level signal when the potentials of the bit lines B110, etc. are higher than the predetermined potential, whereas they output an "H" level signal when the potentials of the bit lines B110, etc. are lower.

The flip-flop circuits FF110, etc. are so configured that they hold the outputs from the comparator circuits Cp110, etc. at rising edges of a trigger signal 101.

In the read only memory configured as described above, prior to the read-out operation, it is determined whether the current adjusting transistors Tr510, etc. are operated or not, according to the following manner.

Figure 5:
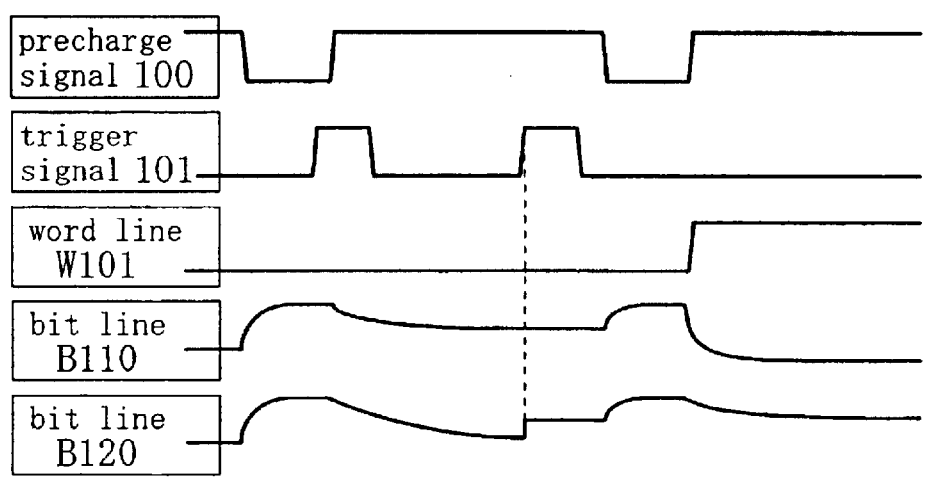
FIG. 5 illustrates signal levels in various portions thereof.

(1) First, as shown in FIG. 5, when the precharge signal 100 becomes an "L" level and at the same time all the word lines W101, etc. become an "L" level, the signal level of each of the bit lines 110, etc. is raised to an "H" level. (Precharge) Then, an "L" level signal is output from the comparator circuit Cp110.

(2) At a time when the potentials of the bit lines are sufficiently raised, an "H" level pulse of the trigger signal 101 is input to each of the flip-flop circuits FF110, etc., and the "L" level signal supplied from the comparator circuits Cp110, etc. is held and simultaneously output to the constant current supply-controlling circuit 310'. Then, the constant current cut-off transistors Tr313, etc. are switched to an ON state, and the current adjusting transistors Tr510, etc. are switched to an OFF state (a state in which a current is not supplied to the bit lines B110, etc.) by power supply voltage applied to the gates thereof.

(3) When the precharge period ends and the precharge signal 100 becomes an "H" level, the potentials of the bit lines B110, etc. gradually decrease until the supplied currents from each of the constant current outputting circuit 210', etc. (i.e., currents that correspond to supplying capabilities) become equal to the total of the off leakage currents of the N-channel MOS transistors Tr111, etc. whose drains are connected to the bit Lines B110, etc.

At this time, when the off leakage currents of the N-channel MOS transistors Tr111, etc. are smaller than a predetermined magnitude, the potentials of the bit lines B110, etc. become higher than the reference potential signal 102 and the outputs from the comparator circuits Cp110, etc. are maintained at an "L" level. On the other hand, when the off leakage currents of the N-channel MOS transistors Tr111, etc. are larger than the predetermined magnitude, the potentials of the bit lines B110, etc. become lower than the reference potential signal 102, resulting in an "H" level signal output from the comparator circuits Cp110, etc.

(4) When an "H" level pulse of the trigger signal 101 is again input to the flip-flop circuits FF110, etc. at a time when the current from the constant current outputting circuits 210', etc. become equal to the off leakage current, signal levels that are output from the comparator circuits Cp110, etc. are held in the flip-flop circuits FF110, etc. according to the magnitude of each of the off leakage currents. Then, according to the signal levels held in the flip-flop circuits, operations of the current adjusting transistors Tr510, etc. are controlled by the constant current supply-controlling circuits 310', etc. Specifically, when the off leakage current is large, the bit lines B110, etc. are supplied with currents by the current adjusting transistors Tr510, etc. in addition to the P-channel MOS transistors Tr211, etc., and as a result, the potentials of the bit lines B110, etc. is reliably maintained at a higher level than the threshold level of the inverter circuits Inv111, etc. when the N-channel MOS transistors Tr111, etc. are in an OFF state (see, for example, the bit line B120 in FIG. 5). On the other hand, when the off leakage current is small, the current adjusting transistors Tr510, etc. are switched to a cut-off state so that currents are supplied only by the P-channel MOS transistors Tr211, etc., and consequently, an excessive current supply to the bit lines B110, etc. is suppressed. Therefore, when the N-channel MOS transistors Tr111, etc. are in an ON state, the potentials of the bit lines B110, etc. are reliably and quickly reduced below the threshold level of the inverter circuits Inv111, etc. (see, for example, the bit line B110 in FIG. 5).

(5) As described above, once a signal having a level that corresponds to the magnitude of the off leakage current is held in each of the flip-flop circuits FF110, etc., stored data are read out in a similar manner to the foregoing embodiments 1 and 2 via the bit lines B110, etc. in accordance with the selections by word lines W101, etc. based on address signals.

As described above, since the potential levels of the bit lines B110, etc. are monitored and the magnitudes of supplied currents are controlled according to the magnitudes of off leakage currents prior to the start of the read-out operation, malfunctions caused by fluctuations of off leakage currents are prevented. There are cases in which, due to variations in the characteristics of the transistors or the like, the totals of the off leakage currents in each of the bit lines B110, etc. differs from one another and consequently the potentials of the bit lines B110, etc. vary one another even when the numbers of the N-channel MOS transistors connected to each of the bit lines B110, etc. are the same. Even in such a case, since the supplied current is compensated according to actual variations in the potentials of the bit lines B110, etc., operation margins are more appropriately retained both when data "0"s are read out and when data "1"s are read out.

Embodiment 4

Now, an example of the layout technique that attains the read only memories as described above is described in the following.

The read only memories as described above are fabricated, for example, through a wafer process employing, for example, photolithography using mask patterns. The fabrication or the like of the mask patterns are carried out based on the layout data that indicate the layout of the elements and wiring lines that constitute the read only memory, and the layout data are machine compilable, that is, they can be automatically generated using a layout apparatus by specifying the data to be written as well as bit numbers and word numbers, for example. In such a layout apparatus as described above, the elements such as transistors, logic circuits constructed with the combinations thereof, contact holes for connecting the elements and wiring lines through an insulating layer, and so forth are dealt with as cells (leaf cells), and these cells are arranged (laid out) in the apparatus to generate the layout data.

Figure 6:
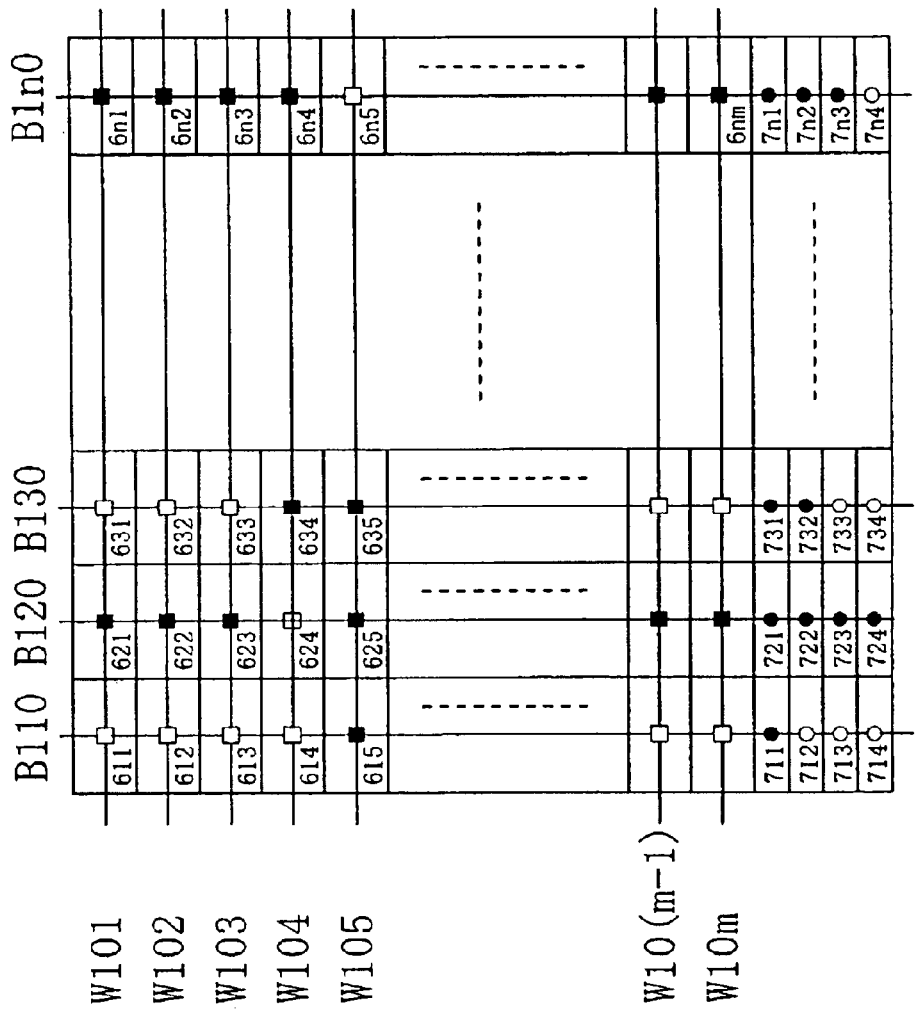
FIG. 6 is a plan view schematically showing the arrangement of the cells in a circuit block that is a principal portion of a read only memory according to Embodiment 4.

FIG. 6 schematically shows the cell arrangement (bit cell array) in a circuit block that is a principal portion of a read only memory. The bit cell array is combined with circuit blocks such as a plurality of similar circuit blocks, address decoding circuits, and controlling circuits (additionally, inverter circuits Inv111, etc. in such cases as the foregoing embodiment 1) as necessary, and thus a read only memory is fabricated in which the arrangement of the elements, such as the transistors, corresponds to the cell arrangement.

In the figure, N-channel MOS transistor cells 611–6 nm represent the cells that correspond to the previously-described N-channel MOS transistors Tr111, etc., the P-channel MOS transistor cells 711–7 nm represent the cells that correspond to the previously-described P-channel MOS transistors Tr211, etc. that constitute the pull-up circuits 210, etc. or the constant current outputting circuits 210', etc. The bit lines B110, etc. are arranged parallel to one another and so are the word lines W101, etc. The N-channel MOS transistor cells 611, etc. are arranged in an array form so as to correspond the positions where these lines intersect. More specifically, the N-channel MOS transistor cells 611, etc. arrayed along the horizontal direction of the figure are so disposed that the gates thereof are respectively connected to common word lines W101, etc. and the N-channel MOS transistor cells 611, etc. arrayed along the vertical direction of the figure are so disposed that the drains thereof are respectively positioned so as to overlap with common bit lines B101, etc. (for example, so that the bit lines B110, etc. are positioned over the drain portions thereof). At the positions where the drain portions and the bit lines B110, etc. overlap with each other, contact cells corresponding to contact holes, which are represented by black squares in the figure, are disposed according to write data (bit data).

The layout described thus far is the same as the layouts of conventional read only memories. Then, in the read only memories according to the present embodiment, four P-channel MOS transistor cells 711, etc. are additionally disposed along each of the bit lines B110, etc. so that the drain portions thereof overlap with each of the bit lines B110, etc. At the positions where the drain portions and the bit lines B110, etc. overlap with each other, contact cells, represented by black circles "●" in the figure, are disposed so that the number of the contact cells is equal to the number of the P-channel MOS transistors provided in accordance with the number of the contact cells corresponding to each of the bit lines B110, etc., that is, in accordance with the number of the N-channel MOS transistors Tr111, etc. connected to each of the bit lines B110, etc. as explained in (a) to (d) in Embodiment 1.

The layout operation as described above is carried out, for example, in the following manner. First, as in conventional read only memories, word lines W101, etc, N-channel MOS transistor cells 611, etc, bit lines B110, etc. and contact cells corresponding to data "1"s to be written, are arranged as described above. In addition, P-channel MOS transistor cells 711, etc., the number of which is the required maximum, are arranged. Next, the number of the contact cells corresponding to the N-channel MOS transistor cells 611, etc. is counted, and according to the number obtained, the number of the contact cells corresponding to the P-channel MOS transistor cells 711, etc. is determined. It should be noted that in place of counting the number of the contact cells, it is possible to count the number of write data "0"s. Thereafter, the contact cells according to the determined number are arranged as described above.

By carrying out the layout operation in this manner, the automatic layout of, for example, the pull-up circuits having predetermined drive capabilities for arbitrary write data, can be easily achieved in a similar manner to the automatic layout in the case in which only write data are set.

Moreover, as described above, each bit line has a maximum number of the P-channel MOS transistor cells 711, etc. and the drive capability for the bit line is determined by the presence or absence of the provision of contact cells. Therefore, only contact cells need to be varied according to write data and the rest of the portions can have the same configurations. As a consequence, the degree of commonization in the layout processes, the mask patterns, the fabrication processes, and so forth can be increased, and thus, the fabrication of read only memories is facilitated. Further, since the steps until the contact cell formation can be performed prior to determination of the write date, a time required for completing the fabrication can be reduced by performing, after determination of the write data, the steps subsequent to the formation of the contact cell layouted as above.

Although the above-described example shows an example for a read only memory in which data are written at the stage of manufacture, the invention is not limited thereto. A commonly-called programmable read only memory may be constructed by making the N-channel MOS transistors Tr111, etc. and the P-channel MOS transistors Tr211, etc. connectable to/disconnectable from the bit lines B110, etc. at least one time. Write data are set by connecting/disconnecting the N-channel MOS transistors Tr111, etc. to/from the bit lines B110, etc., and the drive capability for each of the bit lines B110, etc. may be set by connecting/disconnecting the P-channel MOS transistors Tr211, etc. to/from the bit lines B110, etc. so that the numbers of the P-channel MOS transistors Tr211, etc. that are connected to/disconnected from the bit lines B110, etc. correspond to the write data. In this case, when a dedicated writing device or the like is used for the connection/disconnection, the information that indicates the P-channel MOS transistors Tr211, etc. that are connected to/disconnected from the bit lines B110, etc. may be supplied to the writing device in addition to the write data. If the information on the connection/disconnection is generated in the writing device from write data, it is possible to obtain a read only memory in which write data can be read out without causing malfunctions caused by off leakage current by merely providing write data to the writing device as in the cases of ordinary programmable read only memories.

It should be noted that the configurations and variations described in the above-described embodiments may be combined in various ways.

Specifically, for example, although Embodiment 3 shows an example in which the constant current outputting circuits 210', etc. and so forth continually supply electric current to the bit lines B110, etc., it is also possible that, as in Embodiments 1 and 2, the current supply may be stopped according to, for example, outputs from the inverter circuits Inv111, etc. when the potentials of the bit lines B110, etc. become lower than a predetermined potential.

Conversely, in Embodiments 1 and 2, electric current may be continually supplied as is supplied by the constant current outputting circuits 210', etc. of Embodiment 3. In these cases as well, the drive capability is determined according to the number of the N-channel MOS transistors Tr111, etc. and therefore the resulting advantageous effects can be obtained.

In addition, the configuration in which the supplied current is adjusted by the current adjusting transistors Tr510, etc. as shown in Embodiment 3 may be applied to Embodiment 1.

In addition, although the foregoing embodiments show examples in which the numbers of the N-channel MOS transistors Tr111, etc. are categorized into four groups and the numbers of the P-channel MOS transistors Tr211, etc. are determined according to the groups, the invention is not so limited. The number of the groups may be two groups or three groups, or more than four groups, according to the capacity of the memory, for example. In addition, it is possible that the P-channel MOS transistors 211, etc. in which the drive capability per one transistor corresponds to the off leakage current of each one of the N-channel MOS transistors Tr111, etc. are provided so that the number of the P-channel MOS transistors 211, etc. is equal to the number of the N-channel MOS transistors Tr111, etc. connected to each of the bit lines B110, etc. and thus the number of the connected N-channel MOS transistors Tr111, etc. and the drive capability are in a proportionality relation of 1:1, in order to accurately compensate the off leakage currents. In addition, the drive capabilities of the P-channel MOS transistors Tr211, etc. need not be equal to each other but, for example, they may be varied to be the multiples of the powers of 2 so that the total of the drive capabilities can be finely set by the combinations.

In addition, although the foregoing embodiment 3 describes an example in which one current adjusting transistor such as Tr510 is provided for each of the bit lines B110, etc., the invention is not so limited. For example, current adjusting transistors may be provided in such a manner that the number thereof is the same as the number of the P-channel MOS transistors Tr211, etc. in each of, the constant current outputting circuits 210', etc., or that the transistor size thereof corresponds to the number of the P-channel MOS transistors Tr211, etc. Further, it is possible to provide a plurality of sets of comparator circuits Cp110, etc. to adjust the supply current at multiple levels based on a plurality of kinds of reference potential signals 102. Moreover, in place of controlling the current adjusting transistors Tr510, etc., the P-channel MOS transistors Tr211, etc. may be individually controlled. Specifically, the numbers of the P-channel MOS transistors Tr211, etc. connected to the bit lines B110, etc. are not predetermined, but the numbers of the P-channel MOS transistors Tr211, etc. that are effective may be determined based on the above-described detection of off leakage currents in use (if this is the case, the condition subsequent to the above adjustment becomes substantially the same as the condition in which the P-channel MOS transistors Tr211, etc. are provided in such a manner that the numbers thereof correspond to the numbers of the N-channel MOS transistors Tr111, etc. connected to the bit lines B110, etc.).

In addition, in the foregoing embodiment 3, the voltage applied to the gates of the P-channel MOS transistors Tr211, etc. by the constant current controlling circuit 400 may be finely adjusted, in place of controlling the ON/OFF of the current adjusting transistors Tr510, etc.

Further, in place of controlling the ON/OFF of the current adjusting transistors Tr510, etc. using comparators and flip-flops as in the foregoing embodiment 3, it is possible to use sample hold circuits to detect and hold magnitudes of the off leakage currents and accordingly control the supply currents from the current adjusting transistors Tr510, etc. or from the P-channel MOS transistors Tr211, etc. in a continuously variable or stepless manner.

Figure 7:
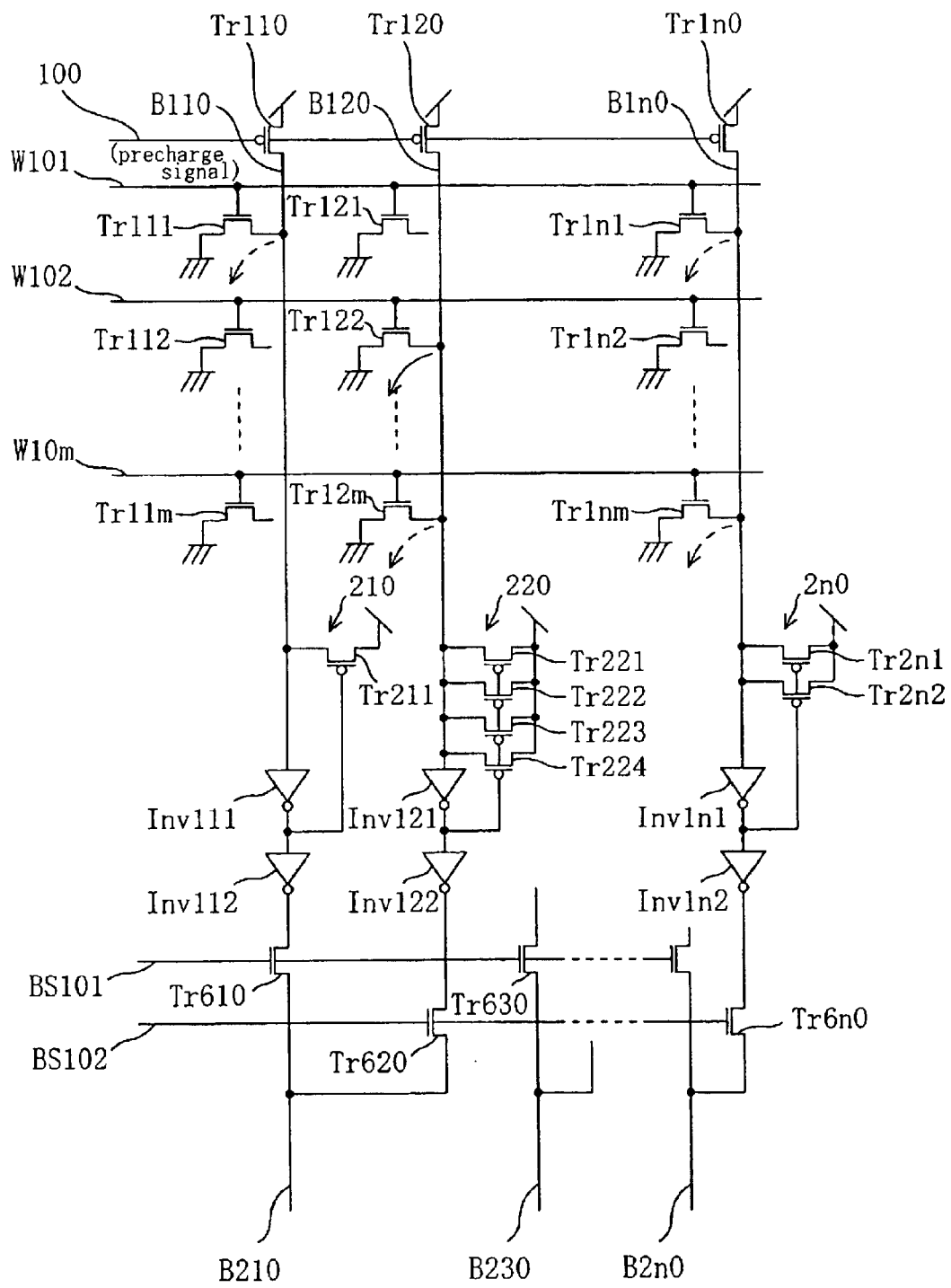
FIG. 7 is a circuit diagram showing the configuration of the principal portion of a variation of a read only memory according to one embodiment.
Figure 8:
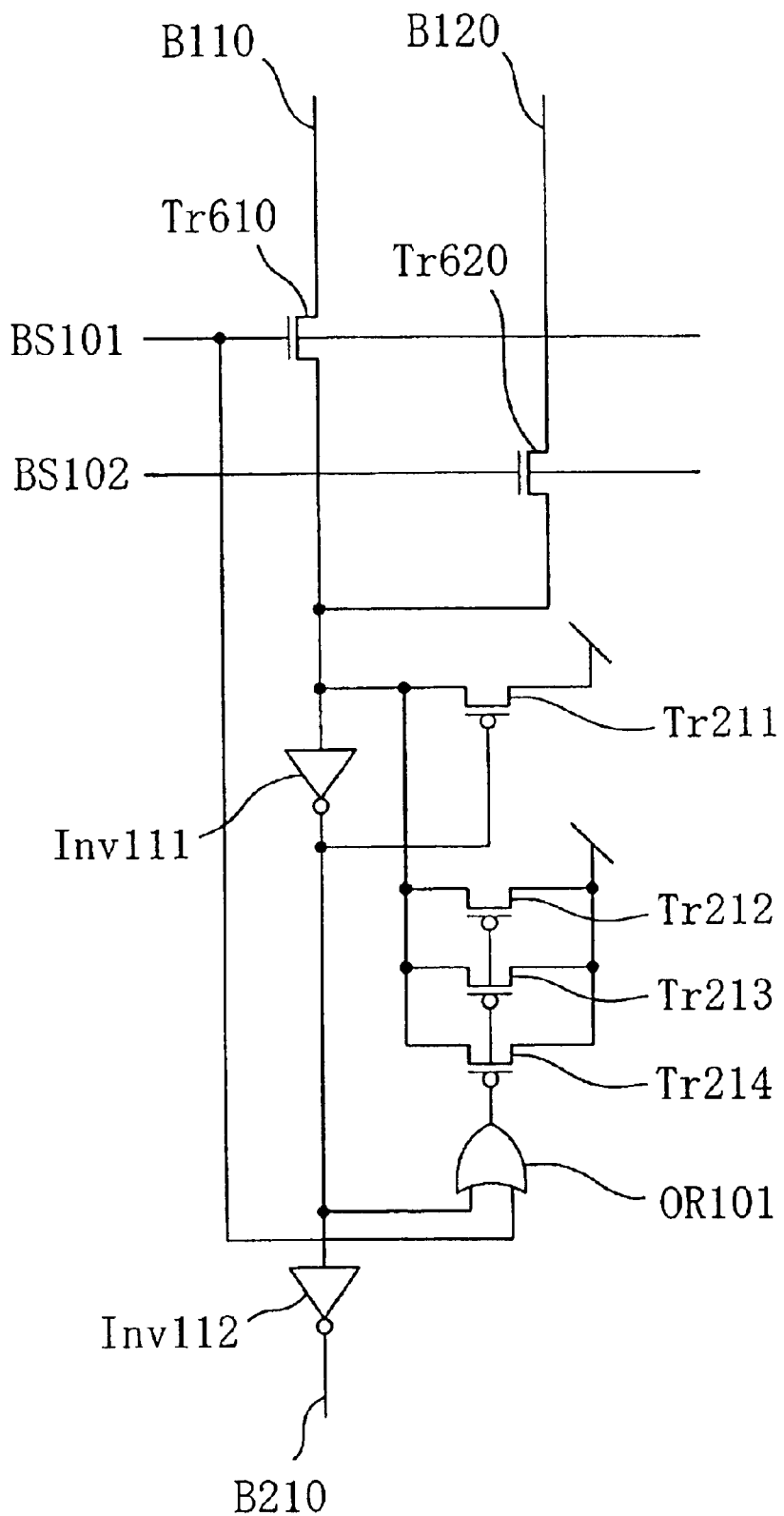
FIG. 8 is a circuit diagram showing the configuration of the principal portion of another variation of a read only memory according to one embodiment.
Figure 9:
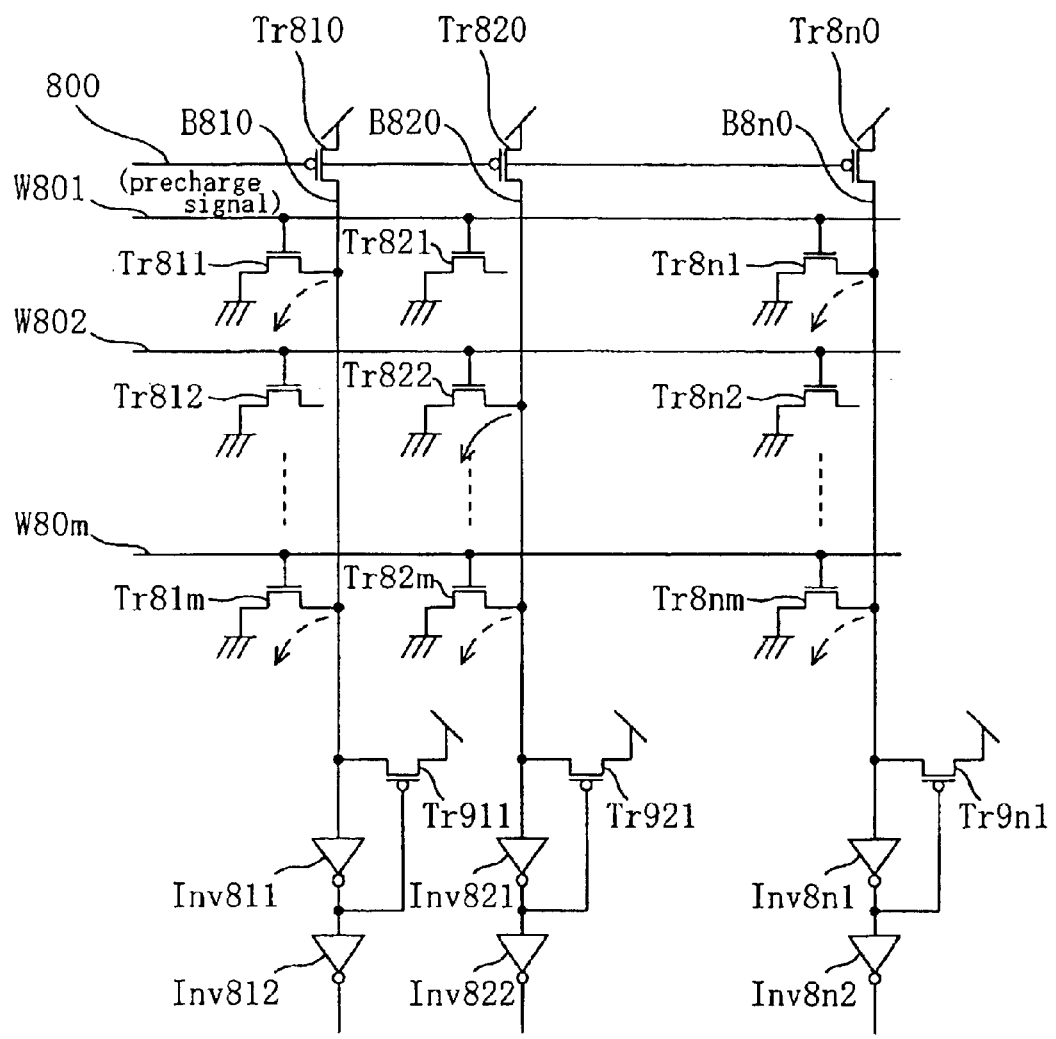
FIG. 9 is a circuit diagram showing the configuration of the principal portion of a conventional read only.
Figure 10:
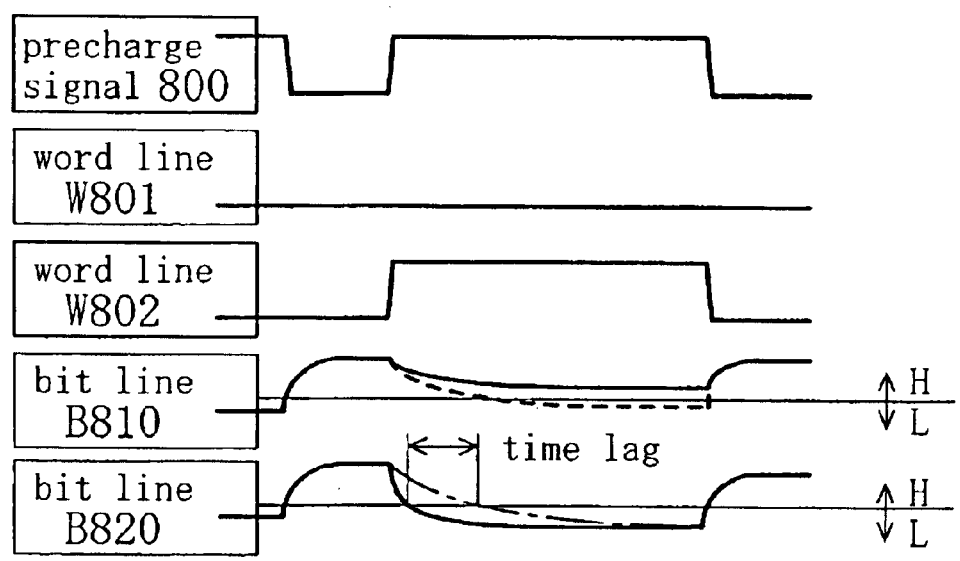
FIG. 10 illustrates signal levels in various portions thereof.

In addition, all the outputs from the inverter circuits Inv112 to Inv1n2 need not be simultaneously output as described in the foregoing embodiments. Instead, for example, as shown in FIG. 7, the inverters may be put into sets each having a plurality of inverters (in the example of FIG. 7, two inverters are assigned as a set) and the output from either one of the sets may be selectively output to output bit lines B210, etc. via bit line-selecting transistors Tr610–Tr6n0 that are controlled by bit line-selecting signals BS101 and BS102. This configuration achieves a read only memory having a large address width in effect. In this case, it is also possible to provide the bit line-selecting transistors Tr610, etc. on the input sides of the inverter circuits Inv111, etc. so that the bit lines B110, etc. can be directly selected. When this is the case, the pull-up circuits 210, etc. may be connected to the output sides of the bit line-selecting transistors Tr610, etc., not directly to the bit lines B110, etc. If this is the case, it is necessary that the numbers of the P-channel transistors Tr211, etc. in the pull-up circuits 210, etc. correspond to the numbers of the N-channel MOS transistors Tr111, etc., connected to the bit lines B110, etc. that are selected. This can be achieved by a specific example as follows; each of the output bit lines B210–B2n0 is provided with a plurality of pull-up circuits, the plurality of pull-up circuits are selectively connected to the output sides of the bit line-selecting transistors Tr610–Tr6n0 and the numbers of the P-channel MOS transistors Tr211, etc. correspond to the respective bit lines B110, etc. In this case, the pull-up circuit 210 can be commonly used when, in each set, the bit lines B110, etc. have the same number of the N-channel MOS transistors Tr111, etc. that are connected thereto. In addition, as in another example shown in FIG. 8, it is possible that four P-channel MOS transistors Tr211 to Tr214 are provided for the bit lines B110 and B120 and the gates thereof are connected to the output terminal of the inverter circuit Inv111 or an OR circuit OR101. Specifically, in the example shown by the figure, the P-channel MOS transistor Tr111 is always in an ON state when the selected one of the bit lines B110 and B120 is at an "H" level (when the output of the inverter circuit Inv111 is an "L" level). On the other hand, the P-channel MOS transistors Tr212 to Tr214 are in an ON state only when the bit line B120 is selected (when the bit line-selecting signal BS101 is an "L" level and the bit line-selecting signal BS102 is an "H" level) and the bit line B120 is at an "H" level (when the output of the inverter circuit Inv111 is an "L" level). Therefore, by setting which of the inverter circuit Inv111 and the OR circuit OR101 is connected to the gates of the P-channel MOS transistors Tr211 to Tr214, the same effect can be obtained as is obtained when the P-channel MOS transistors Tr211, etc. are connected to the output sides of the bit line-selecting transistors Tr610, etc. in such a manner that the number of the P-channel MOS transistors corresponds to the selected bit line B110 or B120, as in the above-described example. The same effect can be obtained also when a three-input OR circuit is provided for each of the gates of the P-channel MOS transistors Tr211, etc. such that one of the input terminals of each OR circuit is connected to the output terminal of the inverter circuit Inv111, another one of the input terminals is connected to the bit line selecting signal BS101 or a low voltage power supply VSS, and the remaining one of the input terminals is connected to the bit line-selecting signal BS102 or the low voltage power supply VSS. In addition, these configurations described above may be applied to the configurations of FIGS. 3 and 4, or the combination thereof.

As has been described thus far, according to the present invention, a current corresponding to the number of the switching elements connected to a bit line is supplied to the bit line to compensate the off leakage current, and as a result, malfunctions and degradations in circuit characteristics that are caused by off leakage current are easily prevented. Accordingly, threshold voltages of the switching elements or the like that constitute the read only memory can be lowered, and high-speed operation as well as low power consumption due to low voltage operation can be achieved.

In addition, by supplying electric current to the bit lines with the use of constant current circuits, the supplied current does not increase even when the potentials of the bit lines decrease. Therefore, the potentials of the bit lines can be quickly and sufficiently reduced, and consequently, operation speed is improved and margins in the output circuits are increased.

In addition, more accurate compensation for off leakage current can be carried out and operation margins of the circuits can be ensured by employing current mirror circuits as the constant current circuits to supply electric current to the bit lines using as a reference the current that is generated by the same kind of switching elements as the switching elements connected to the bit lines.

In addition, current supply to bit lines is controlled, for example, by controlling the active or non-active state of the constant current circuits according to the potentials of the bit lines. Consequently, when the bit lines are discharged, the potentials of the bit lines can be more quickly and sufficiently reduced, and thus stability in the discharge operation can be improved.

In addition, the numbers of switching elements connected to bit lines are categorized in a plurality of groups, and current supply capabilities of current supplying circuits are determined according to the groups. Hence, the number of types of current supplying circuits having differing current supplying capabilities can be reduced, and thus, simplification of the configuration can be easily achieved.

In addition, a supplied current to a bit line may be adjusted by, for example, monitoring the potential of the bit line affected by off leakage currents when the switching elements are in an OFF state. Accordingly, even when the off leakage current varies from one switching element to another, it is possible to supply a current to the bit line according to the varying off leakage currents, so that the off leakage currents can be compensated more accurately and margins of the reading operation can be ensured.

In addition, a plurality of current supplying portions that constitute a current supplying circuit may be provided and the current supplying capabilities may be varied according to the presence or absence of the connection between the current supplying portions and bit lines. Consequently, the elements or the like that constitute a read only memory can be easily laid out automatically, and thus the fabrication is facilitated due to the simplified fabrication process.

In addition, by providing a plurality of current supplying portions that constitute a current supplying circuit so as to be connectable to/disconnectable from the bit lines, off leakage currents can be appropriately compensated so that malfunctions and operation speed reduction can be prevented even in a read only memory such that data to be read out can be set (written) after the fabrication.

The invention may be embodied in other forms without departing from the spirit or essential characteristics thereof. Thee embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A read only memory having a plurality of bit lines, a plurality of word lines, and a plurality of switching elements, wherein data corresponding to the presence or absence of switching elements connected to the bit lines are read out by discharging electric charge precharged in the bit lines with the switching elements selected by the word lines, the read only memory comprising:

at least one current supplying circuit that supplies current to one of the bit lines when the switching elements are selected by the word lines;

wherein the current supplying capability of the current supplying circuit is determined according to the number of the switching elements connected to the one of the bit lines.

2. The read only memory according to claim 1, wherein the current supplying circuit is a constant current circuit.

3. The read only memory according to claim 2, wherein the constant current circuit comprises:

a reference current generating circuit for generating a predetermined reference current using the same type of switching element as the switching elements; and a current mirror circuit for mirroring the reference current and supplying electric current to the bit line;

wherein the mirror ratio of the current mirror circuit is determined according to the number of the switching elements.

4. The read only memory according to claim 1, wherein the current supplying circuit supplies an electric current to the bit line when the potential of the bit line is higher than a predetermined potential whereas the current supplying circuit cuts off electric current to the bit line when the potential of the bit line is lower than the predetermined potential.

5. The read only memory according to claim 1, wherein the numbers of the switching elements to be connected to the bit lines are categorized into a plurality of groups, and the current supplying capability of the current supplying circuit is determined according to the groups.

6. The read only memory according to claim 1, further comprising a current adjusting circuit for adjusting the current supplying capability according to the potential of the bit line when all the switching element connected to the bit line are in an OFF state.

7. The read only memory according to claim 6, wherein the current adjusting circuit comprises:
- a comparator circuit that compares the potential of the bit line with a predetermined reference potential when all the switching elements connected to the bit line are in an OFF state;
- a holding circuit that holds a comparison result obtained by the comparator circuit; and
- an adjusted current supplying circuit that supplies a current to the bit line according to the data held in the holding circuit.

8. The read only memory according to claim 3, further comprising a current adjusting circuit for adjusting the current supplying capability according to the potential of the bit line when all the switching element connected to the bit line are in an OFF state.

9. The read only memory according to claim 8, wherein the current adjusting circuit comprises:
- a comparator circuit that compares the potential of the bit line with a predetermined reference potential when all the switching elements connected to the bit line are in an OFF state;
- a holding circuit that holds a comparison result obtained by the comparator circuit; and
- an adjusted current supplying circuit that supplies a current to the bit line according to the data held in the holding circuit.

10. A read only memory having a plurality of bit lines, a plurality of word lines, and a plurality of switching elements, wherein data corresponding to the presence or absence of switching elements connected to the bit lines are read out by discharging electric charge precharged in the bit lines with the switching elements selected by the word lines, the read only memory comprising:
- a plurality of current supplying portions that constitute a current supplying circuit having a predetermined current supplying capability and supplying electric current when the switching elements are selected to the word line;
- wherein at least one of the current supplying portions is connected to one of the bit lines according to the number of the switching elements connected to the bit line.

11. The read only memory according to claim 10, wherein the current supplying circuit is a constant current circuit.

12. The read only memory according to claim 11, wherein the constant current circuit comprises:
- a reference current generating circuit for generating a predetermined reference current using the same type of switching element as the switching elements; and
- a current mirror circuit for mirroring the reference current and supplying electric current to the bit line;
- wherein the mirror ratio of the current mirror circuit is determined according to the number of the switching elements.

13. The read only memory according to claim 10, wherein the numbers of the switching elements to be connected to the bit lines are categorized into a plurality of groups, and the current supplying capability of the current supplying circuit is determined according to the groups.

14. A read only memory comprising:
- a plurality of switching elements provided so as to be connectable to and/or disconnectable from bit lines;
- wherein data to be read out are set by connecting and/or disconnecting the switching elements to/from the switching elements from the bit lines; and
- wherein, when reading out data, data corresponding to the presence or absence of switching elements connected to the bit lines are read out by discharging electric charge precharged in the bit lines with the switching elements selected by word lines;
- wherein the read only memory has a plurality of current supplying portions that constitute a current supplying circuit and are provided so as to be connectable to and/or disconnectable from the bit lines, the current supplying portions supplying electric current to the bit lines when the switching elements are selected by the word lines.

15. The read only memory according to claim 14, wherein the current supplying circuit is a constant current circuit.

16. The read only memory according to claim 15, wherein the constant current circuit comprises:
- a reference current generating circuit for generating a predetermined reference current using the same type,of switching element as the switching elements; and
- a current mirror circuit for mirroring the reference current and supplying electric current to the bit line;
- wherein the mirror ratio of the current mirror circuit is determined according to the number of the switching elements.

* * * * *